United States Patent
Park

(10) Patent No.: US 7,804,346 B2
(45) Date of Patent: Sep. 28, 2010

(54) LEVEL CONVERTING FLIP-FLOP AND METHOD OF OPERATING THE SAME

(75) Inventor: Jae-ho Park, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 5 days.

(21) Appl. No.: 12/153,229

(22) Filed: May 15, 2008

(65) Prior Publication Data

US 2008/0290921 A1    Nov. 27, 2008

(30) Foreign Application Priority Data

May 25, 2007   (KR)   ...................... 10-2007-0051079

(51) Int. Cl.
  *H03K 3/356*   (2006.01)
(52) U.S. Cl. ...................... 327/208; 327/218
(58) Field of Classification Search ................ 327/208, 327/333, 50–57, 199–203, 209–214, 218; 326/80, 81
  See application file for complete search history.

(56) References Cited

U.S. PATENT DOCUMENTS 5,646,642 A    7/1997   Maekawa et al.
7,468,615 B1 *  12/2008   Tan et al. ...................... 326/68

FOREIGN PATENT DOCUMENTS

| JP | 11-186883 | 9/1999 |
| JP | 2005-109902 | 4/2005 |
| KR | 10-0261179 | 4/2000 |
| KR | 2001-0063077 | 7/2001 |
| KR | 10-2003-0019873 | 3/2003 |

OTHER PUBLICATIONS

Office Action dated Aug. 28, 2008 issued for counterpart Korean Application No. 10-2007-0051079.

* cited by examiner

*Primary Examiner*—Lincoln Donovan
*Assistant Examiner*—Diana J Cheng
(74) *Attorney, Agent, or Firm*—Harness, Dickey & Pierce, P.L.C.

(57) ABSTRACT

A level converting flip-flop may include a data input circuit, a clocking circuit, a current mirror circuit, and/or a latch circuit. The data input circuit may be configured to generate a pull-up current in response to an input data signal having one of an input supply voltage smaller than an output supply voltage and a ground voltage. The clocking circuit configured to provide the pull-up current to an internal node in response to a clock signal having the input supply voltage and the ground voltage. The current mirror circuit may be configured to pull-up an output node to the output supply voltage in response to the pull-up current provided to the internal node. The latch circuit may be configured to latch an output data signal generated at the output node.

9 Claims, 5 Drawing Sheets

FIG. 6

| VDDH | 2[V] | | | |
|---|---|---|---|---|
| | DELAY (ps) | POWER (μw) | PDP (fJ) | RATIO |
| CONVENTIONAL ART 1 | 468 | 0.238 | 0.111 | 1 |
| EXAMPLE EMBODIMENT | 330 | 0.254 | 0.084 | 0.76 |
| VDDH | 4[V] | | | |
| CONVENTIONAL ART 1 | 508 | 0.96 | 0.488 | 1 |
| EXAMPLE EMBODIMENT | 402 | 0.95 | 0.382 | 0.78 |
| VDDH | 6[V] | | | |
| CONVENTIONAL ART 1 | 744 | 2.84 | 2.111 | 1 |
| EXAMPLE EMBODIMENT | 500 | 2.45 | 1.225 | 0.58 |

LEVEL CONVERTING FLIP-FLOP AND METHOD OF OPERATING THE SAME

PRIORITY STATEMENT

This application claims the benefit of priority to Korean Patent Application No. 10-2007-0051079 filed on May 25, 2007, in the Korean Intellectual Property Office, the entire contents of which are incorporated herein in their entirety by reference.

BACKGROUND

1. Field

Example embodiments relate to an electronic circuit, and for example, to a level converting flip-flop and/or a method of operating the same.

2. Description of Related Art

A level converting flip-flop is a circuit for interfacing circuits having different supply voltages. The level converting flip-flop may be placed between a logic circuit, e.g., a logic controller or a memory included in an integrated circuit (IC), and an input/output circuit inputting or outputting a signal used in the logic circuit. The level converting flip-flop may be used in a write/read circuit of a flash memory, a data path of a thin film transistor (TFT) liquid crystal display (LCD) driver IC, a data path of a low-temperature poly-silicon (LTPS) TFT LCD driver IC, a method of dynamic voltage scaling, and a method of clustered voltage scaling. The method of dynamic voltage scaling and the method of clustered voltage scaling are used for embodying a system consuming less power.

FIG. 1 is a circuit diagram illustrating a conventional level converting flip-flop 100. The conventional level converting flip-flop 100 is a conditionally dischargeable level converting flip-flop. Referring to FIG. 1, the conventional level converting flip-flop 100 converts an input data signal D having an input supply voltage VDDL (for example, 1.5 V) into an output data signal Q having an output supply voltage VDDH (for example, 2.3 V) that is larger than the input supply voltage VDDL, in response to a clock signal CK. The conventional level converting flip-flop 100 generates an inverse signal QB of the output data signal Q.

The conventional level converting flip-flop 100 uses a weak P-channel metal-oxide-semiconductor (PMOS) transistor P1 in order to pull-up a voltage of a node NX. The PMOS transistor P1 has a smaller current-driving capability and pre-charges the node NX as an output supply voltage VDDH.

A pull-up operation of the level converting flip-flop 100 may be explained as follows. If the input data signal D makes a transition from a low level, e.g., a ground voltage VSS, to a high level, e.g., the input supply voltage VDDL, a conflict between the turned-on PMOS transistor P1 and turned-on N-channel metal-oxide-semiconductor (NMOS) transistors N1, N3, N5, and N7 occurs. If the conflict occurs, the output data signal Q makes a transition to a high level, e.g., the output supply voltage VDDH.

A short-circuit current flows through the PMOS transistor P1 and the NMOS transistors N1, N3, N5, and N7 because of the conflict. In order to reduce the amount of short-circuit current, the PMOS transistor P1 may be fabricated to be of a smaller size. However, if a length of a channel and a width of a channel of the PMOS transistor P1 become smaller, a pre-charge speed of the node NX decreases, and the level converting flip-flop 100 may not operate at a higher speed.

During the pull-up operation of the conventional level converting flip-flop 100, the node NX fully swings between an output supply voltage VDDH and a ground voltage VSS. Accordingly, the conventional level converting flip-flop 100 may consume a larger amount of electric power and have a pull-up speed of a smaller output data signal Q.

A pull-up speed of the output data signal Q is determined according to a level of the output supply voltage VDDH and sizes, e.g., channel lengths and widths, of the PMOS transistors P1 and P2. A pull-down speed of the output data signal Q is determined according to a level of the input supply voltage VDDL and the sizes, e.g., channel lengths and widths, of NMOS transistors N2, N4, and N6. Accordingly, a clock-to-output time (e.g., a delay time until the output data signal Q occurs after a clock signal CK is input) may be significantly changed according to changes in the input supply voltage VDDL. A clock-to-output time if the output data signal Q rises to a high level, e.g., the output supply voltage VDDH, and a clock-to-output time if the output data signal Q falls to a low level, e.g., the ground voltage VSS, change according to changes in the output supply voltage VDDH, and a duty ratio of the output data signal Q may significantly change. Accordingly, a propagation delay time of the conventional level converting flip-flop 100 may not be constant because of the changes in the output supply voltage VDDH.

FIG. 2 is a circuit diagram illustrating another conventional level converting flip-flop 200. The conventional level converting flip-flop 200 is a circuit having a flip-flop connected in parallel to a level converter. The conventional level converting flip-flop 200 may be used in a TFT LCD driver IC and a LTPS TFT LCD driver IC. The conventional level converting flip-flop 200 may have a larger circuit area.

Referring to FIG. 2, the conventional level converting flip-flop 200 converts an input data signal D having an input supply voltage VDDL into an output data signal having an output supply voltage VDDH that is larger than the input supply voltage VDDL in response to a clock signal CK.

If the level converting flip-flop 200 performs a pull-up operation or a pull-down operation, a conflict between turned-on PMOS transistors 201 and 203 and a turned-on NMOS transistor 205 or between turned-on PMOS transistors 202 and 204 and a turned-on NMOS transistor 206 occurs. Due to the conflict, a short-circuit current IS1 flows through the PMOS transistors 201 and 203 and the NMOS transistor 205 or a short-circuit current IS2 flows through the PMOS transistors 202 and 204 and the NMOS transistor 206. The conventional level converting flip-flop 200 may consume a larger amount of electric power and have a pull-up speed and pull-down speed of a smaller output data signal.

A pull-up speed of the output data signal is determined according to a level of the output supply voltage VDDH and the sizes, e.g., channel lengths and widths, of the PMOS transistors 201, 202, 203, and 204. A pull-down speed of the output data signal is determined according to a level of the input supply voltage VDDL and the sizes, e.g., channel lengths and widths, of the NMOS transistors 205 and 206. A clock-to-output time may significantly change according to changes in the output supply voltage VDDH. The clock-to-output time if the output data signal rises to a high level, e.g., the output supply voltage VDDH, and the clock-to-output time if the output data signal falls to a low level, e.g., the input supply voltage VSS, change according to changes in the output supply voltage VDDH, and a duty ratio of the output data signal may significantly change. Accordingly, a propagation delay time of the conventional level converting flip-flop 200 may not be constant because of changes in the output supply voltage VDDH.

SUMMARY

Example embodiments provide a level converting flip-flop configured to be more insensitive to changes of a wider ranging output supply voltage, and/or an operation method of the same.

A level converting flip-flop may include a data input circuit, a clocking circuit, a current mirror circuit, and/or a latch circuit. The data input circuit may be configured to generate a pull-up current in response to an input data signal having one of an input supply voltage smaller than an output supply voltage and a ground voltage. The clocking circuit may be configured to provide the pull-up current to an internal node in response to a clock signal having the input supply voltage and the ground voltage. The current mirror circuit may be configured to pull-up an output node to the output supply voltage in response to the pull-up current provided to the internal node. The latch circuit may be configured to latch an output data signal generated at the output node.

According to an example embodiment, the data input circuit may be configured to generate a pull-down current in response to the input data signal, and/or the clocking circuit may be configured to provide the pull-down current to the output node in response to the clock signal.

According to an example embodiment, the level converting flip-flop may include a switch transistor. The switch transistor may be configured to block the pull-up current in response to an inverse signal of the output data signal. A source of the switch transistor may be connected to the ground voltage.

According to an example embodiment, the input data signal may be activated after the clock signal.

According to an example embodiment, the data input circuit may be connected to the clocking circuit and/or between the switch transistor and the ground voltage.

According to an example embodiment, the data input circuit may include a first input transistor, a first inverter, and/or a second input transistor. The first input transistor may include a gate configured to receive the input data signal and a source connected to a drain of the switch transistor. The first inverter may be configured to invert the input data signal. The second input transistor may include a gate configured to receive an output signal of the first inverter and a source connected to the ground voltage.

According to an example embodiment, the clocking circuit may include a buffer, a second inverter, a first clocking transistor, a second clocking transistor, and/or a third clocking transistor. The buffer may be configured to buffer the clock signal. The second inverter may be configured to generate a delayed inverse clock signal by inverting an output signal of the buffer. The first clocking transistor may be configured to provide the pull-up current to the internal node in response to the clock signal. A source of the first clocking transistor may be connected to a drain of the first input transistor. The second clocking transistor may be configured to provide the pull-down current to the output node in response to the clock signal. A source of the second clocking transistor may be connected to a drain of the second input transistor. The third clocking transistor may be configured to provide the pull-down current to a source of the second clocking transistor in response to the delayed inverse clock signal.

According to an example embodiment, the third clocking transistor may be configured to block the pull-down current in response to the delayed inverse clock signal, and/or an active period of the clock signal and the inverse signal of the output data signal may be shorter than an active period of the clock signal and the delayed inverse clock signal.

According to an example embodiment, the current mirror circuit may include a voltage source transistor and/or a first pull-up transistor. The voltage source transistor may include a source connected to the output supply voltage and a gate and a drain connected to the internal node. The first pull-up transistor may include a source connected to the output supply voltage, a gate connected to the gate of the voltage source transistor, and a drain connected to the output node.

According to an example embodiment, at least one of a channel width and length of the voltage source transistor may be a same size as at least one of a channel width and length of the first pull-up transistor.

According to an example embodiment, at least one of the channel width and length of the voltage source transistor, at least one of the channel width and length of the first pull-up transistor, at least one of a channel width and length of the first input transistor, and at least one of a channel width and length of the second input transistor may be adjusted to vary at least one of a speed at which the output node is pulled-up to the output supply voltage and a speed at which the output node is pulled-down to the ground voltage.

According to an example embodiment, the latch circuit may include a third inverter, a second pull-up transistor, and/or a pull-down transistor. The third inverter may be configured to invert the output data signal to output the inverse signal of the output data signal. The second pull-up transistor may be configured to pull-up the output node to the output supply voltage in response to the inverse signal of the output data signal. The pull-down transistor may be configured to pull-down the output node to the ground voltage in response to the inverse signal of the output data signal.

According to an example embodiment, at least one of a channel width and length of the second input transistor may be smaller than at least one of a channel width and length of the second pull-up transistor.

According to an example embodiment, a level converting flip-flop may include a pull-up circuit and/or a latch circuit. The pull-up circuit may be configured to drive an output node to an output supply voltage that is larger than an input supply voltage in response to an input data signal and a clock signal having the input supply voltage and a ground voltage. The latch circuit may be configured to latch an output data signal generated at the output node. The pull-up circuit may include a current mirror circuit configured to pull-up the output node to the output supply voltage in response to a pull-up current generated from the input data signal.

According to an example embodiment the level converting flip-flop may include a pull-down circuit configured to drive the output node to the ground voltage in response to the input data signal and the clock signal.

According to an example embodiment, the pull-up circuit may further include a switch transistor configured to block the pull-up current flowing through the pull-up circuit in response to an inverse signal of the output data signal. The pull-down circuit may be configured to pull-down the output node to the ground voltage in an active period of the clock signal and a delayed inverse signal of the clock signal. An active period of the clock signal and the inverse signal of the output data signal may be shorter than an active period of the clock signal and the delayed inverse signal of the clock signal.

According to an example embodiment, the input data signal may be activated after the clock signal.

According to an example embodiment, the latch circuit may include a pull-up transistor and/or a pull-down transistor.

The pull-up transistor may be configured to pull-up the output node to the output supply voltage in response to the inverse signal of the output data signal. The pull-down transistor may be configured to pull-down the output node to the ground voltage in response to the inverse signal of the output data signal.

According to an example embodiment, a current mirror ratio of the current mirror circuit may be adjusted to vary at least one of a speed at which the output node is pulled-up to the output supply voltage and a speed at which the output node is pulled-down to the ground voltage.

According to an example embodiment a method may include generating a pull-up current in response to an input data signal having one of an input supply voltage that is smaller than an output supply voltage and a ground voltage, providing the pull-up current to an internal node in response to a clock signal having the input supply voltage and the ground voltage, performing a current mirror operation in response to the pull-up current provided to the internal node to pull-up an output node to the output supply voltage; and/or latching an output data signal generated at the output node.

According to an example embodiment, the method may include generating a pull-down current in response to the input data signal and/or providing the pull-down current to the output node in response to the clock signal to pull-down the output node to the ground voltage.

According to an example embodiment, the method may include adjusting the current mirror ratio of the current mirror operation to adjust at least one of a speed of pulling-up the output node to the output supply voltage and a speed of pulling-down the output node to the ground voltage.

According to an example embodiment, the latching the output data signal may include pulling-down the output node to the ground voltage in response to an inverse signal of the output data signal.

According to an example embodiment, the latching the output data signal may include pulling-up the output node to the output supply voltage in response to an inverse signal of the output data signal. The current generated if the output node is pulled-up to the output supply voltage in response to the inverse signal may be smaller than the current generated if the output node is pulled-up up to the output supply voltage by the current mirror operation.

According to an example embodiment, the input data signal may be activated after the clock signal.

According to an example embodiment, the method may include blocking the pull-up current in response to an inverse signal of the output data signal.

According to an example embodiment, the method may include blocking the pull-down current in response to a delayed inverse signal of the clock signal. An active period of the clock signal and the inverse signal of the output data signal is shorter than an active period of the clock signal and the delayed inverse signal of the clock signal.

BRIEF DESCRIPTION OF THE DRAWINGS

The above and/or other aspects and advantages will become more apparent and more readily appreciated from the following detailed description of example embodiments taken in conjunction with the accompanying drawings of which:

FIG. 6 is a table comparing a power delay product (PDP) of an example embodiment with a PDP of a conventional flip-flop according to changes in an output supply voltage.

DETAILED DESCRIPTION OF EXAMPLE EMBODIMENTS

Figure 1:
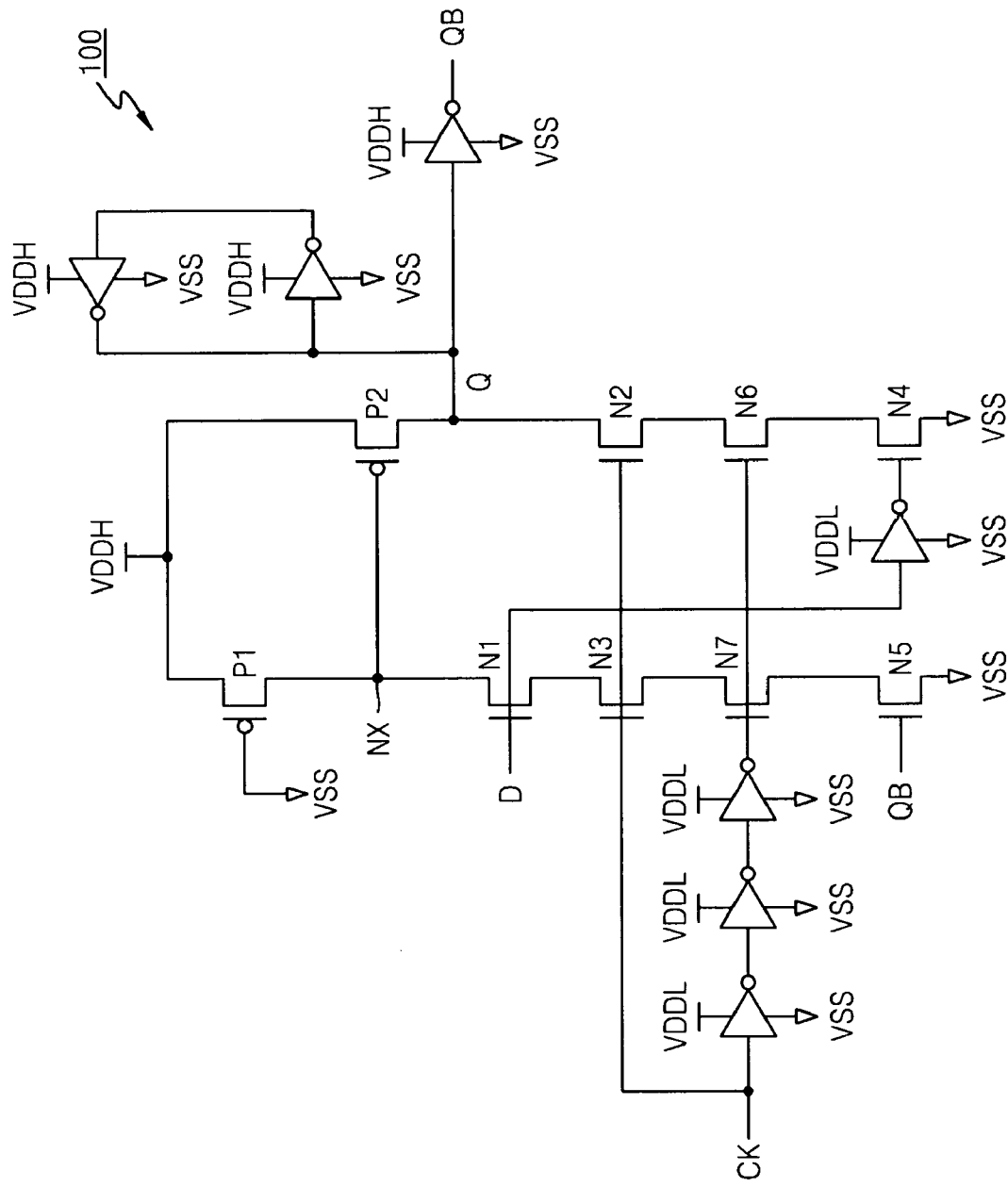
FIG. 1 is a circuit diagram illustrating a conventional level converting flip-flop.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 3:
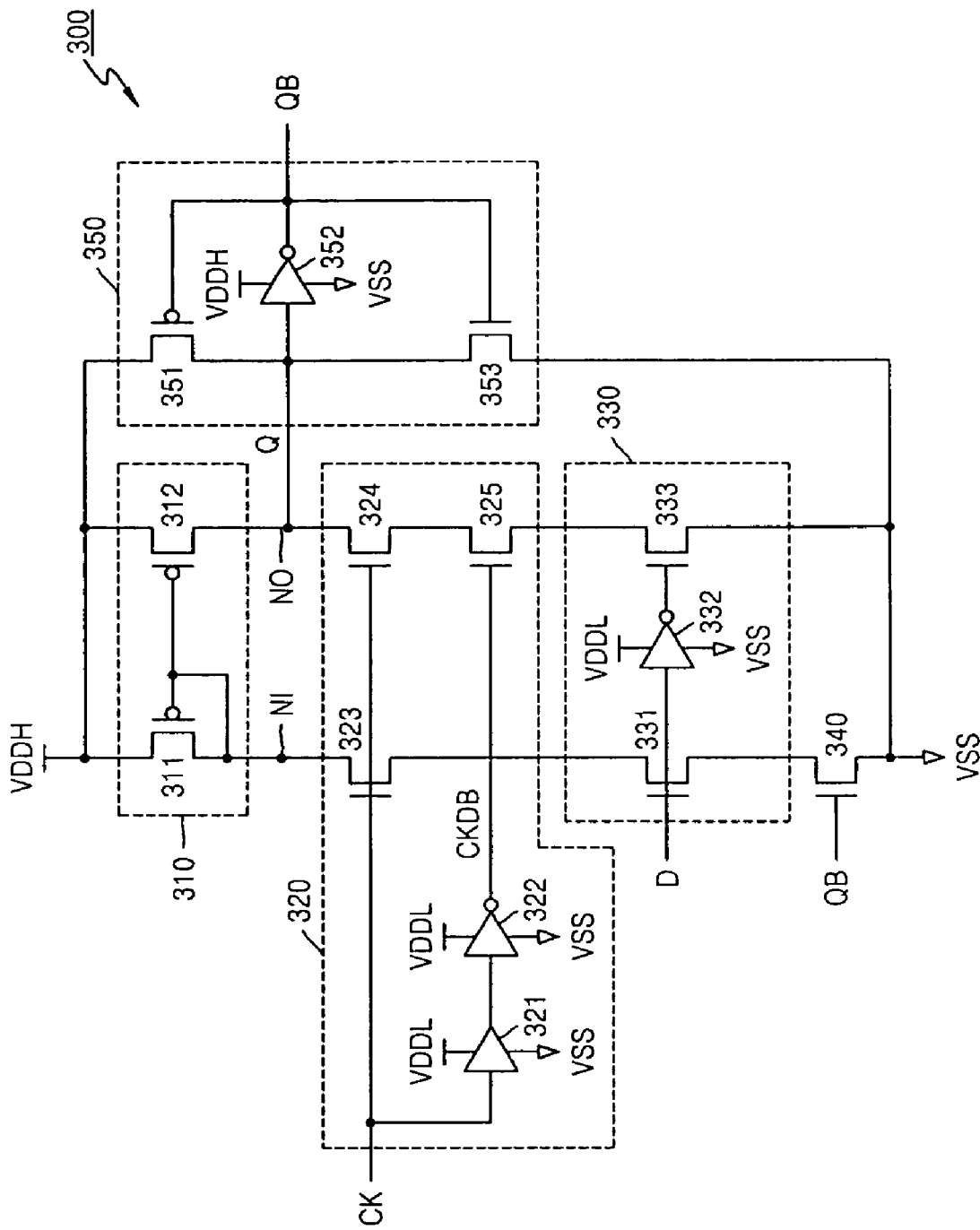
FIG. 3 is a circuit diagram illustrating a level converting flip-flop according to an example embodiment.

FIG. 3 is a circuit diagram illustrating a level converting flip-flop 300 according to an example embodiment. Referring to FIG. 3, the level converting flip-flop 300 may convert an input data signal D having an input supply voltage VDDL (for example, 1.5 V) into an output data signal Q having an output supply voltage VDDH (for example, 2 V to 6.5 V) that is larger than the input supply voltage VDDL in response to a clock signal CK. The clock signal CK may alternate between the ground voltage VSS and the input supply voltage VDDL.

The input data signal D may have a positive set-up time or a negative set-up time. The positive set-up time may indicate that the input data signal D is activated before the clock signal CK. The negative set-up time may indicate that the input data signal D is activated after the clock signal CK. If the input data signal D has the negative set-up time the level converting flip-flop 300 may be stronger against a clock skew.

The level converting flip-flop 300 may include a current mirror circuit 310, a clocking circuit 320, a data input circuit 330, a switch transistor 340, and/or a latch circuit 350.

The data input circuit 330 may generate a pull-up current or a pull-down current in response to the input data signal D, which may have the input supply voltage VDDL or the ground voltage VSS.

If the level converting flip-flop 300 performs a pull-up operation of an output data signal Q, the pull-up current may flow through a voltage source transistor 311 and a first pull-up transistor 312 of the current mirror circuit 310, a first clocking transistor 323 of the clocking circuit 320, a first input transistor 331 of the data input circuit 330, and/or the switch transistor 340. If the level converting flip-flop 300 performs a pull-down operation of the output data signal Q, the pull-down current may flow through a second clocking transistor 324, a third clocking transistor 325 of the clocking circuit 320, and/or a second input transistor 333 of the data input circuit 330.

The data input circuit 330 may include the first input transistor 331, a first inverter 332, and the second input transistor 333. The first and second input transistors 331 and 333 may be N-channel metal-oxide-semiconductor (NMOS) transistors. The first and second input transistors 331 and 333 may be lower voltage transistors having lower withstand voltages.

The first input transistor 331 may include a gate receiving the input data signal D, a source connected to a drain of the switch transistor 340, and/or a drain connected to a source of the first clocking transistor 323 of the clocking circuit 320. The first inverter 332, which may receive the input supply voltage VDDL as a power supply voltage, may invert the input data signal D. The second input transistor 333 may include a gate receiving an output signal of the first inverter 332, a source connected to the ground voltage VSS, and/or a drain connected to a source of the third clocking transistor of the clocking circuit 320.

The clocking circuit 320 may provide the pull-up current to an internal node NI or provide the pull-down current to an output node NO in response to a clock signal CK having the input supply voltage VDDL or the ground voltage VSS.

The clocking circuit 320 may include a buffer 321, a second inverter 322, the first clocking transistor 323, the second clocking transistor 324, and/or the third clocking transistor 325. The first through third clocking transistors 323, 324, and 325 may be NMOS transistors. The first clocking transistor 323 may be a higher voltage transistor having a higher withstand voltage, and the second and third clocking transistors 324 and 325 may be lower voltage transistors.

The buffer 321, which may receive the input supply voltage VDDL as a power supply voltage, may buffer the clock signal CK. The second inverter 322, which may receive the input supply voltage VDDL as a power supply voltage, may generate a delayed inverse clock signal CKDB by inverting an output signal of the buffer 321. The first clocking transistor 323 may provide the pull-up current to the internal node NI in response to the clock signal CK activated to a high level, e.g., the input supply voltage VDDL. A drain of the first clocking transistor 323 may be connected to the internal node NI. The second clocking transistor 324 may provide the pull-down current to the output node NO in response to the clock signal CK activated to a high level, e.g., the input supply voltage VDDL. A drain of the second clocking transistor may be connected to the output node NO. The third clocking transistor 325 may provide the pull-down current to a source of the second clocking transistor 324 in response to the delayed inverse clock signal CKDB activated to a high level, e.g., the input supply voltage VDDL. A drain of the third clocking transistor 325 may be connected to a source of the second clocking transistor 324. The third clocking transistor 325 may block the pull-down current in response to the delayed inverse clock signal CKDB deactivated to a low level, e.g., the ground voltage VSS.

The second and third clocking transistors 324 and 325 may be turned-on in a period where the clock signal CK and the delayed inverse clock signal CKDB are activated to a high level, e.g., the input supply voltage VDDL, and/or perform the pull-down operation. If the output supply voltage VDDH is higher, an active period that is a time interval where the clock signal CK and the delayed inverse signal CKDB of the clock signal CK are high may be set to be longer, whereas if the output supply voltage VDDH is lower, the active period of the clock signal CK and a delayed inverse signal CKDB of the clock signal CK may be set to be shorter.

The current mirror circuit 310 may perform a current mirror operation and pull-up (e.g., drive) the output node NO to the output supply voltage VDDH, in response to the pull-up current provided to the internal node NI. The current mirror circuit 310 may include the voltage source transistor 311 and/or the first pull-up transistor 312. The voltage source transistor 311 and the first pull-up transistor 312 may be P-channel metal-oxide-semiconductor (PMOS) transistors. The voltage source transistor 311 and the first pull-up transistor 312 may be higher voltage transistors.

The voltage source transistor 311 may have a diode structure and include a source connected to the output supply voltage VDDH. A gate and drain of the voltage source transistor 311 may be connected to the internal node NI. The first pull-up transistor 312 may include a source connected to the output supply voltage VDDH, a gate connected to the gate of the voltage source transistor 311, and/or a drain connected to the output node NO. A size, e.g., a channel length and/or width, of the voltage source transistor 311 may be the same as a size, e.g., a channel length and/or width, of the first pull-up transistor 312.

The latch circuit 350 may latch the output data signal Q generated from the output node NO, and/or generate an inverse signal QB of the output data signal Q. The latch circuit 350 may include a second pull-up transistor 351, a third inverter 352, and/or a smaller sized, e.g., smaller channel length and/or width, pull-down transistor 353. The second pull-up transistor 351 may be a PMOS transistor and the pull-down transistor 353 may be an NMOS transistor. The second pull-up transistor 351 and the pull-down transistor 353 may be higher voltage transistors.

The third inverter 352, which may receive the output supply voltage VDDH as a power supply voltage, may generate the inverse signal QB of the output data signal Q by inverting the output data signal Q. The second pull-up transistor 351 may pull-up the output node NO to the output supply voltage VDDH in response to the output signal QB of the third inverter 352. A drain of the second pull-up transistor 351 may be connected to the output node NO and/or a source of the second pull-up transistor 351 may be connected to the output supply voltage VDDH.

The pull-down transistor 353 may pull-down the output node NO to the ground voltage VSS in response to the output signal QB of the third inverter 352. A source of the pull-down transistor 353 may be connected to the ground voltage VSS and/or a drain of the pull-down transistor 353 may be connected to the output node NO. For example, the pull-down transistor 353 may prevent the output node NO from becoming a high level, e.g., the output supply voltage VDDH, by using an external noise input to the internal node NI. If the clock signal CK makes a transition from a high level, e.g., the input supply voltage VDDL, to a low level, e.g., the ground voltage VSS, the pull-down transistor 353 may remove a coupling noise generated in the output node NO by coupling capacitance, and/or control a voltage of the output node NO so that the output node NO is maintained more exactly at the ground voltage VSS.

The switch transistor 340 may be an NMOS transistor and a source of the switch transistor 340 may be connected to the ground voltage VSS. The switch transistor 340 may block the pull-up current in response to the inverse signal QB of the output data signal Q deactivated to a low level. e.g., the ground voltage VSS.

The switch transistor 340 and the first clocking transistor 323 may be turned-on in a period where the clock signal CK and the inverse signal QB of the output data signal Q are activated to perform the pull-up operation. The switch transistor 340 may block the pull-up current after the output node NO is pulled-up to the output supply voltage VDDH and a delay time of the third inverter 352 is exceeded. Therefore, an active period of the clock signal CK and the inverse signal QB of the output data signal Q, e.g., a period where both signals are high, may be shorter than an active period of the clock signal CK and the delayed inverse signal CKDB of the clock signal CK. The switch transistor 340 may reduce the amount of current consumed by the level converting flip-flop 300 because the pull-up current flows in the relatively shorter active period of the clock signal CK and the inverse signal QB of the clock signal CK.

The input data signal D in a flip-flop may have a positive set-up time. Accordingly, in order to reduce parasitic capacitance of the level converting flip-flop 300, the data input circuit 330 may be connected to the clocking circuit 320 and/or between the switch transistor 340 and the ground voltage VSS.

The level converting flip-flop 300 may include a pull-up circuit and/or a pull-down circuit. The pull-up circuit may drive the output node NO to the output supply voltage VDDH in response to the input data signal D and the clock signal CK. The pull-up circuit may include the current mirror circuit 310, the first clocking transistor 323 of the clocking circuit 320, the first input transistor 331 of the data input circuit 330, and/or the switch transistor 340. The current mirror circuit 310 may pull-up the output node NO to the output supply voltage VDDH in response to the pull-up current generated from the input data signal D. The pull-down circuit may drive the output node NO to the ground voltage VSS in response to the input data signal D and the clock signal CK. The pull-down circuit may include the second and third clocking transistors 324 and 325 of the clocking circuit 320 and/or the second input transistor 333 of the data input circuit 330.

The pull-up operation of the level converting flip-flop 300 may be explained as follows. If the input data signal D makes a transition from a low level, e.g., the ground voltage VSS, to a high level, e.g., the input supply voltage VDDL, in an active period of the clock signal CK and the inverse signal QB of the output data signal Q, the pull-up current flowing through the pull-up circuit may be provided to the output node NO and/or the output node NO may be pulled-up to the output supply voltage VDDH. If the pull-up operation is performed, the output node NO may be substantially driven by the first pull-up transistor 312 of the current mirror circuit 310. If the delay time of the third inverter 352 is exceeded, the second pull-up transistor 351 of the latch circuit 350 may additionally drive the output node NO. The current generated if the second pull-up transistor 351 drives the output node NO may be smaller.

If a pull-up operation using the current mirror circuit 310 is performed, fighting which usually occurs between transistors in conventional techniques need not occur and/or a short-circuit current need not flow. Accordingly, the speed of the pull-up operation may be increased and the amount of current consumed by the level converting flip-flop 300 may be reduced.

If the pull-up operation is performed, a voltage of the internal node NI may be changed to the output supply voltage VDDH-Vgs (a gate-source voltage), and/or the voltage of the internal node NI may be changed to the output supply voltage VDDH if the pull-up operation is complete. Vgs may indicate a gate voltage for a source of the voltage source transistor 311 in the current mirror circuit 310. The Vgs, which is a voltage change of the internal node NI, may be much smaller compared to a swing range of the node NX of the conventional level converting flip-flop 100 illustrated in FIG. 1. Accordingly, the speed of the pull-up operation may be increased and/or the amount of current consumed by the level converting flip-flop 300 may be reduced.

The pull-down operation of the level converting flip-flop 300 may be explained as follows. If the input data signal D makes a transition from a high level, e.g., the input supply voltage VDDL, to a low level, e.g., the power supply voltage VSS, in an active period of the clock signal CK and the delayed inverse signal CKDB of the clock signal CK, the pull-down current flowing through the pull-down circuit may be provided to the output node NO and the output node NO may be pulled-down to the ground voltage VSS. If the pull-down operation is performed, a conflict may occur between the second input transistor 333 of the data input circuit 330 and the second pull-up transistor 351 of the latch circuit 350. However, a short-circuit current caused by the conflict may be reduced because the second input transistor 333 is a smaller sized, e.g., smaller channel length and/or width, PMOS transistor than the second pull-up transistor 351.

As described above, an operation speed and/or an amount of current consumed in the pull-up operation and the pull-down operation may be determined according to the sizes, e.g., channel lengths and/or widths, of the NMOS transistors 323, 324, 325, 331, 333, and/or 340 and a level of the input supply voltage VDDL, instead of a level of the output supply voltage VDDH. Accordingly, the level converting flip-flop 300 may be more insensitive to a wider ranging change in the output supply voltage VDDH and may maintain a propagation delay time according to a change in the output supply voltage VDDH. Therefore, if a difference between the input supply voltage VDDL and the output supply voltage VDDH is larger and a range of the used output supply voltage VDDH is wider, the level converting flip-flop 300 according to an example embodiment may be used.

The speed of the pull-up operation and the pull-down operation of the output data signal Q may be adjusted according to changes in a current mirror ratio of the current mirror circuit 310 or changes in sizes, e.g., channel lengths and/or widths, of the first and second input transistors 331 and 333 of the data input circuit 330. The speed of the pull-up operation may be slower than the speed of the pull-down operation because the number of MOS transistors performing the pull-up operation may be greater than the number of MOS transistors performing the pull-down operation, and/or the parasitic capacitance of the pull-up path (for example, a parasitic capacitance of the internal node NI) may be greater than the parasitic capacitance of the pull-down path. For example, the size, e.g., the channel length and/or width, of the first pull-up transistor 312 of the current mirror circuit 310 may be twice as big as the size, e.g., the channel length and/or width, of the voltage source transistor 311 of the current mirror circuit 310. Therefore, if the size, e.g., the channel length and/or width, of the first input transistor 331 of the data input circuit 330 and the size, e.g., the channel length and/or width, of the second input transistor 333 are decreased by about 50%, the speed of the pull-up operation and the speed of the pull-down operation may become the same.

Figure 4:
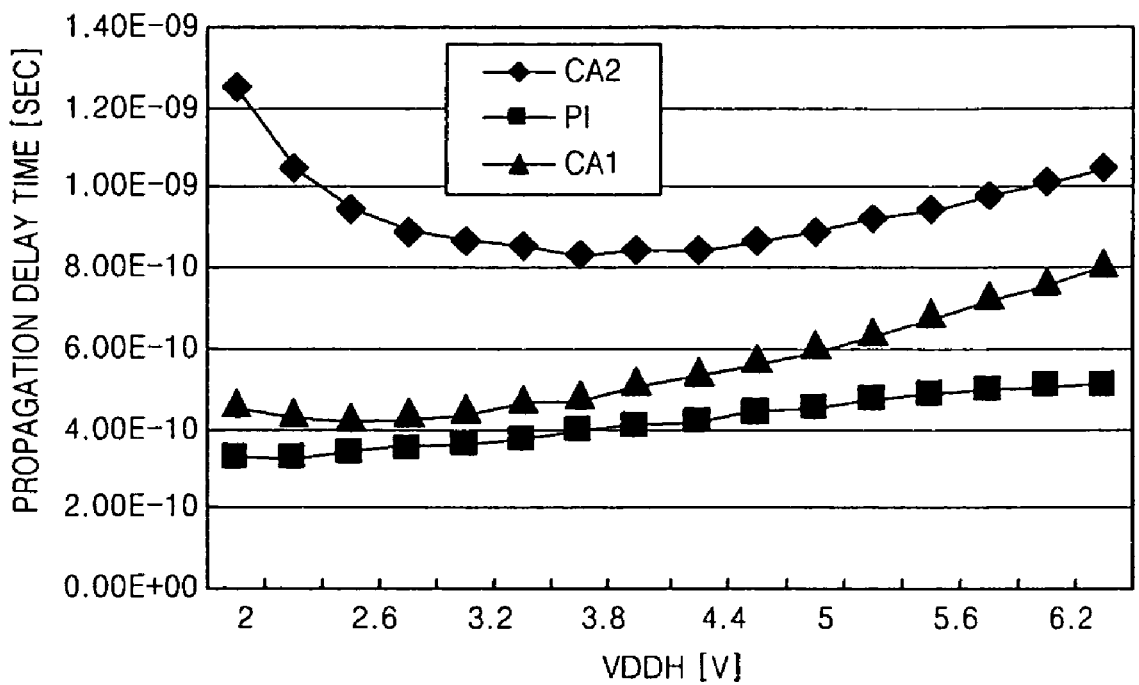
FIG. 4 is an example graph comparing a propagation delay time of an example embodiment with a propagation delay time of a conventional flip-flop according to changes in an output supply voltage.

FIG. 4. is an example graph comparing an example propagation delay time in an example embodiment with an example propagation delay time in a conventional technique according to changes in an output supply voltage.

Figure 2:
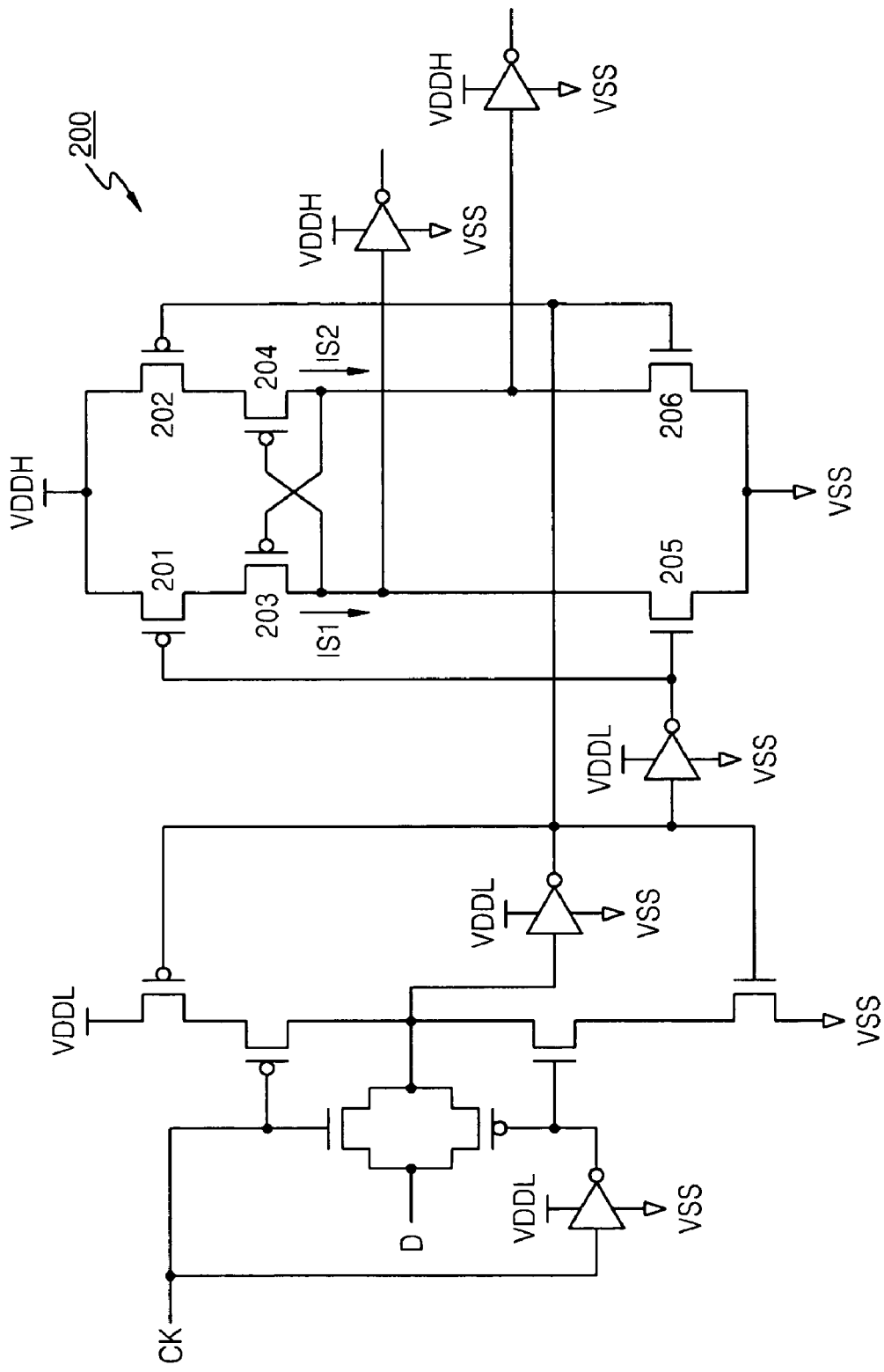
FIG. 2 is a circuit diagram illustrating another conventional level converting flip-flop.

In FIG. 4, "CA1" indicates a propagation delay time of the conventional level converting flip-flop 100 illustrated in FIG. 1, "CA2" indicates a propagation delay time of the conventional level converting flip-flop 200 illustrated in FIG. 2, and "PI" indicates a propagation delay time of the level converting flip-flop 300 according to an example embodiment illustrated in FIG. 3. The propagation delay time is an average value between a clock-to-output time if an output data signal is increased to a high level, e.g., the output supply voltage VDDH, and a clock-to-output time if an output data signal is decreased to a low level, e.g., the ground voltage VSS, provided that the input supply voltage VDDL is 1.5 V.

Referring to FIG. 4, the propagation delay time PI is at least 25% smaller than the propagation delay times CA1 and CA2 in the output power supply section between about 2 V and 6.5 V. The propagation delay time variation according to changes in the output supply voltage for PI is 182 psec which is smaller if compared to the 386 psec propagation delay time variation according to changes in the output supply voltage for CA1.

Figure 5:
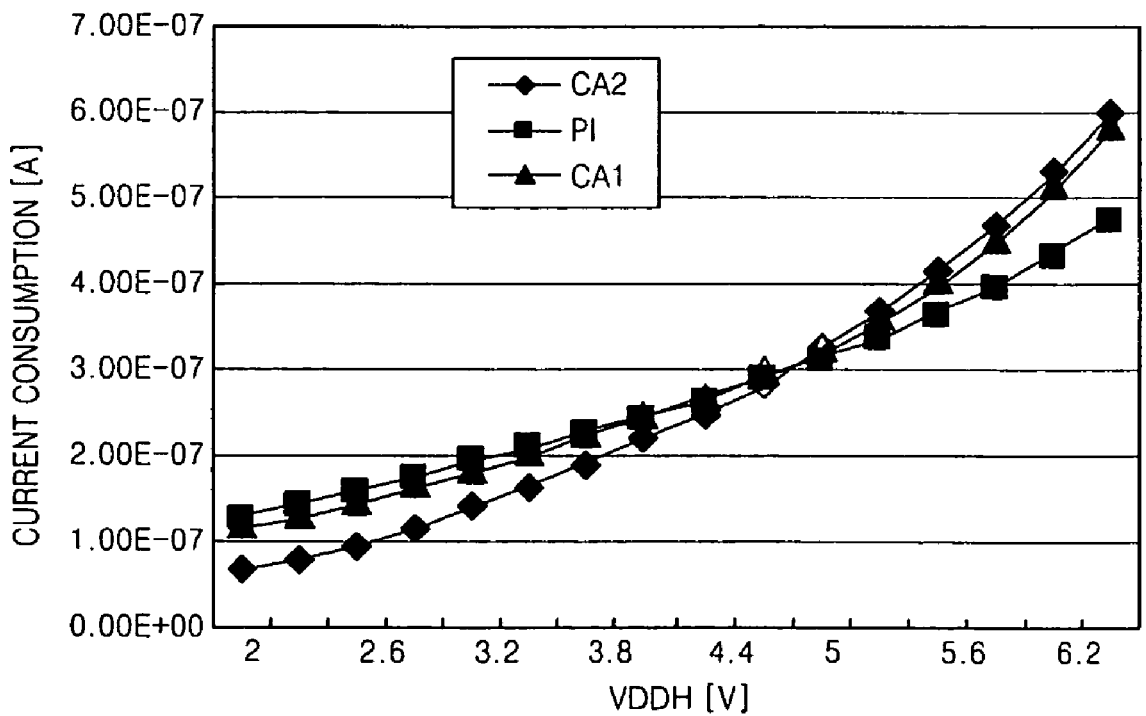
FIG. 5 is an example graph comparing an amount of current consumed by an example embodiment with an amount of current consumed by a conventional flip-flop according to changes in an output supply voltage.

FIG. 5 is an example graph comparing an amount of current consumed in an example embodiment with an amount of current consumed in the conventional technique according to changes in an output supply voltage. In FIG. 5, "CA1" indicates the amount of current consumed by the conventional level converting flip-flop 100 illustrated in FIG. 1, "CA2" indicates the amount of current consumed by the conventional level converting flip-flop 200 illustrated in FIG. 2, and "PI" indicates the amount of current consumed by the level converting flip-flop 300 according to an example embodiment illustrated in FIG. 3. Referring to FIG. 5, the amount of current PI consumed in an example embodiment is smaller at a relatively higher output supply voltage VDDH if compared to the amounts of current CA1 and CA2 consumed in the conventional techniques.

FIG. 6 is a table comparing a power delay product (PDP) of an example embodiment with a PDP of the conventional technique according to changes in an output supply voltage.

In FIG. 6, "conventional art 1" indicates the conventional level converting flip-flop 100 illustrated in FIG. 1, "example embodiment" indicates a level converting flip-flop 300 illustrated in FIG. 3, and simulation results in the table were obtained when a surrounding temperature of the level converting flip-flop circuits was at 25° C.

Referring to FIG. 6, if the output supply voltage VDDH is 2 V, the PDP of an example embodiment is decreased by 24%, compared to the PDP of the conventional art 1. If the output supply voltage VDDH is 4 V, the PDP of an example embodiment is decreased by 22%, compared to the PDP of the conventional art 1. If the output supply voltage VDDH is 6 V, the PDP of an example embodiment is decreased by 42%, compared to the PDP of the conventional art 1.

Values shown in FIGS. 4, 5, and 6 are example simulation values of the level converting flip-flops of an example embodiment and the conventional technique, designed by using a lower voltage transistor and a medium voltage transistor in a 0.13 μm process. A withstand voltage of the lower voltage transistor is 1.5 V, a minimum channel length of the lower voltage transistor is 0.13 μm, and a threshold voltage of the lower voltage transistor is 0.59 V. A withstand voltage of the medium voltage transistor is 6 V, a minimum channel length of the medium voltage transistor is 0.7 μm, and a threshold voltage of the medium voltage transistor is 0.7 V.

A level converting flip-flop according to example embodiments may be more insensitive to wider ranging changes in an output supply voltage and/or maintain a propagation delay time according to changes in an output supply voltage because a speed of a pull-up operation and a pull-down operation may be determined according to a level of an input supply voltage instead of the output supply voltage. A level converting flip-flop according to example embodiments may reduce an amount of current consumed and/or more rapidly operate because no conflict may occur in a pull-up operation using a current mirror circuit and/or the conflict may be reduced in a pull-down operation.

Although example embodiments have been shown and described in this specification and figures, it would be appreciated by those skilled in the art that changes may be made to the illustrated and/or described example embodiments without departing from their principles and spirit.

What is claimed is:

1. A level converting flip-flop comprising:
 a data input circuit configured to generate a pull-up current in response to an input data signal having one of an input supply voltage smaller than an output supply voltage and a ground voltage;
 a clocking circuit configured to provide the pull-up current to an internal node in response to a clock signal having the input supply voltage and the ground voltage;
 a current mirror circuit configured to pull-up an output node to the output supply voltage in response to the pull-up current provided to the internal node;
 a latch circuit configured to latch an output data signal generated at the output node; and
 a switch transistor configured to block the pull-up current in response to an inverse signal of the output data signal, a source of the switch transistor being connected to the ground voltage, wherein the data input circuit is configured to generate a pull-down current in response to the input data signal, the clocking circuit is configured to provide the pull-down current to the output node in response to the clock signal, the data input circuit includes,
- a first input transistor including a gate configured to receive the input data signal and a source connected to a drain of the switch transistor,
- a first inverter configured to invert the input data signal, and
- a second input transistor including a gate configured to receive an output signal of the first inverter and a source connected to the ground voltage, and the clocking circuit includes,
- a buffer configured to buffer the clock signal,
- a second inverter configured to generate a delayed inverse clock signal by inverting an output signal of the buffer,
- a first clocking transistor configured to provide the pull-up current to the internal node in response to the clock signal, a source of the first clocking transistor connected to a drain of the first input transistor,
- a second clocking transistor configured to provide the pull-down current to the output node in response to the clock signal, a source of the second clocking transistor connected to a drain of the second input transistor, and
- a third clocking transistor configured to provide the pull-down current to a source of the second clocking transistor in response to the delayed inverse clock signal.

2. The level converting flip-flop of claim 1, wherein the input data signal is activated after the clock signal.

3. The level converting flip-flop of claim 1, wherein the data input circuit is connected to the clocking circuit and between the switch transistor and the ground voltage.

4. The level converting flip-flop of claim 1, wherein
the third clocking transistor is configured to block the pull-down current in response to the delayed inverse clock signal, and
an active period of the clock signal and the inverse signal of the output data signal is shorter than an active period of the clock signal and the delayed inverse clock signal.

5. The level converting flip-flop of claim 4, wherein the current mirror circuit comprises:
- a voltage source transistor including a source connected to the output supply voltage and a gate and a drain connected to the internal node; and
- a first pull-up transistor including a source connected to the output supply voltage, a gate connected to the gate of the voltage source transistor, and a drain connected to the output node.

6. The level converting flip-flop of claim 5, wherein at least one of a channel width and length of the voltage source transistor is a same size as at least one of a channel width and length of the first pull-up transistor.

7. The level converting flip-flop of claim 5, wherein at least one of the channel width and length of the voltage source transistor, at least one of the channel width and length of the first pull-up transistor, at least one of a channel width and length of the first input transistor, and at least one of a channel width and length of the second input transistor are adjusted to vary at least one of a speed at which the output node is pulled-up to the output supply voltage and a speed at which the output node is pulled-down to the ground voltage.

8. The level converting flip-flop of claim 5, wherein the latch circuit comprises:
- a third inverter configured to invert the output data signal to output the inverse signal of the output data signal;
- a second pull-up transistor configured to pull-up the output node to the output supply voltage in response to the inverse signal of the output data signal; and
- a pull-down transistor configured to pull-down the output node to the ground voltage in response to the inverse signal of the output data signal.

9. The level converting flip-flop of claim 8, wherein at least one of a channel width and length of the second input transistor is smaller than at least one of a channel width and length of the second pull-up transistor.

* * * * *